(12) United States Patent
Wu et al.

(10) Patent No.: US 11,443,726 B2
(45) Date of Patent: Sep. 13, 2022

(54) SOUND ISOLATION WINDOW AND HEAT DISSIPATION STRUCTURE

(71) Applicants: Inventec (Pudong) Technology Corporation, Shanghai (CN); INVENTEC CORPORATION, Taipei (TW)

(72) Inventors: Chun-Tai Wu, Taipei (TW); Yi-Chen Wang, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 465 days.

(21) Appl. No.: 16/712,963

(22) Filed: Dec. 12, 2019

(65) Prior Publication Data
US 2021/0151024 A1     May 20, 2021

(30) Foreign Application Priority Data
Nov. 19, 2019 (CN) .......................... 201911144860.1

(51) Int. Cl.
| | |
|---|---|
| *G10K 11/162* | (2006.01) |
| *F01N 1/04* | (2006.01) |
| *G06F 1/20* | (2006.01) |
| *H05K 7/20* | (2006.01) |

(52) U.S. Cl.
CPC .............. *G10K 11/162* (2013.01); *F01N 1/04* (2013.01); *H05K 7/20172* (2013.01); *H05K 7/20754* (2013.01); *G06F 1/20* (2013.01); *G06F 2200/201* (2013.01)

(58) Field of Classification Search
CPC ...... G06F 1/20; G06F 2200/201; F24F 13/24; F24F 2013/242; F01N 1/04; G10K 11/162
USPC .................................................. 181/224, 225
See application file for complete search history.

(56) References Cited

U.S. PATENT DOCUMENTS

| | | | | |
|---|---|---|---|---|
| 3,511,337 | A * | 5/1970 | Pease ........................ | F02C 7/24 55/482 |
| 4,276,954 | A * | 7/1981 | Romano ................. | E06B 7/084 181/291 |
| 4,316,522 | A * | 2/1982 | Hirschorn .......... | F02M 35/1216 181/252 |
| 5,332,872 | A * | 7/1994 | Ewanek ................ | F04D 29/663 181/258 |
| 5,625,172 | A * | 4/1997 | Blichmann ........ | F02M 35/1261 181/204 |

(Continued)

*Primary Examiner* — Jeremy A Luks
(74) *Attorney, Agent, or Firm* — CKC & Partners Co., LLC

(57) ABSTRACT

A sound isolation window includes a frame and a plurality of sound blocking bars. The frame has an upper frame portion and a lower frame portion. The frame further has a first sidewall and a second sidewall connected to the upper and lower frame portion. The upper frame portion, the lower frame portion, the first sidewall and the second sidewall form a first opening and an opposite second opening. Each sound blocking bar includes a plane perpendicular to the upper frame portion and the lower frame. The sound blocking bars are arranged along the first direction from the first opening to the second opening and spaced apart from each other. Projections along the first direction of the sound blocking bars over the first opening cover the first opening. The width of each sound blocking bar is less than one-half of the width of the first opening.

9 Claims, 4 Drawing Sheets

(56) References Cited

U.S. PATENT DOCUMENTS

| | | | | | |
|---|---|---|---|---|---|
| 6,104,608 | A | * | 8/2000 | Casinelli | F24F 13/24 |
| | | | | | 181/224 |
| 6,481,527 | B1 | * | 11/2002 | French | H05K 7/20736 |
| | | | | | 181/198 |
| 7,161,801 | B2 | * | 1/2007 | Chen | G06F 1/20 |
| | | | | | 181/198 |
| 7,353,908 | B1 | * | 4/2008 | French | G10K 11/17861 |
| | | | | | 381/71.5 |
| 7,646,603 | B2 | * | 1/2010 | Bard | H05K 7/20745 |
| | | | | | 361/701 |
| 7,712,576 | B2 | * | 5/2010 | Goto | G06F 1/182 |
| | | | | | 181/205 |
| 10,126,039 | B2 | * | 11/2018 | Boehringer | F24F 13/24 |
| 11,289,064 | B2 | * | 3/2022 | Doglio | G10K 11/162 |
| 2018/0090181 | A1 | * | 3/2018 | Paterra | G11B 33/1486 |

* cited by examiner

SOUND ISOLATION WINDOW AND HEAT DISSIPATION STRUCTURE

RELATED APPLICATIONS

This application claims priority to China Application Serial Number 201911144860.1, filed Nov. 19, 2019, which are herein incorporated by reference.

BACKGROUND

Field of Disclosure

The present invention relates to a sound isolation window. More particularly, the present invention is used for reducing noises from cooling components.

Description of Related Art

At present, due to the improvement of the performance of components such as processors and the use of various high-performance PCIe cards, temperature of the internal of computer systems such as servers has also increased. Therefore, in order to solve the problem of heat dissipation, a high revolution speed fan system is used by the corresponding heat dissipation component to solve the problem of excessive temperature. For example, the revolution speed of the used fan is increased from more than 10,000 revolutions per minute (RPM) to 20,000 RPM, or even more than 30,000 RPM.

However, with the increase of the revolution speed, the fan generates a larger amount of vibration and sound than before. It will affect the performance of high-density storage hard disks, and there may even be a risk that damage to the hard disks has caused data loss.

Accordingly, how to provide a solution to solve the aforementioned problems becomes an important issue to be solved by those in the industry.

SUMMARY

To achieve the above object, an aspect of the present invention is related to a sound isolation window, which can improve the noise issues affecting hard disk performance.

According to some embodiments of the present invention, a sound isolation window includes a frame and a plurality of sound blocking bars. The frame has an upper frame portion, an opposite lower frame portion and a first sidewall and a second sidewall connected to the upper frame portion and the lower frame portion. The lower frame portion, the first sidewall and the second sidewall form a first opening and an opposite second opening. Two end of each sound blocking bar are respectively connected to the first sidewall and the second sidewall. Each sound blocking bar comprises a plane perpendicular to the upper frame portion and the lower frame. The sound blocking bars are arranged along the first direction from the first opening to the second opening and spaced apart from each other. Projections along the first direction of the sound blocking bar over the first opening cover the first opening, and the width of each sound blocking bar is less than one-half of the width of the first opening.

In one or more embodiments of the present invention, the frame further has a third sidewall connected to the upper frame portion and the lower frame portion. The third sidewall is located outside the first sidewall and the second sidewall and is adjacent to the second side wall, the upper frame portion. The third sidewall is located outside the first sidewall and the second sidewall and is adjacent to the second side wall, the upper frame portion. A plurality of sound blocking bar is located between the second sidewall and the third sidewall.

In one or more embodiments of the present invention, the sound blocking bars partially overlap each other in a second direction perpendicular to the first direction.

In one or more embodiments of the present invention, the planes of the sound blocking bars are perpendicular to the first sidewall and the second sidewall.

In one or more embodiments of the present invention, the sound blocking bars are arranged in parallel in the first direction. The sound blocking bars are arranged in parallel in the first direction.

In one or more embodiments of the present invention, the sound blocking bars are in a stepped arrangement.

In one or more embodiments of the present invention, sound blocking bar form an upper stepped arrangement structure and a lower stepped arrangement structure. The upper and lower stepped arrangement structure are mirror symmetry.

In one or more embodiments of the present invention, a first sound blocking bar of the sound blocking bar is immediately adjacent to the first opening. A second sound blocking bar of the sound blocking bar is immediately adjacent to the second opening and connected to the upper frame portion. Another second sound blocking bar is immediately adjacent to the second opening and connected to the lower frame portion. The two second sound blocking bars are opposite to each other. In some embodiments, a part of the sound blocking bars arrange along a third direction extending from the first sound blocking bar to the second sound blocking bar in a stepped arrangement. Another apart of the sound blocking bars arrange along a fourth direction extending from the first sound blocking bar to another second sound blocking bar in a stepped arrangement.

Another aspect of the present invention is related to a thermal dissipation structure.

According to one or more embodiments of the present invention, a thermal dissipation structure includes an above sound isolation window and a fan. The fan is located at a side of the sound isolation window. The planes of the sound blocking bars face toward the fan.

In summary, the present invention is related to a sound isolation window having sound blocking bars evenly spacing apart from each other. Planes of the sound isolation window can directly face to the fan used for cooling to isolate the caused noise. The air flow can flows to the spacing between the sound blocking bars to minimize the effect on the thermal dissipation function. The thermal dissipation structure is formed by the above sound isolation window and the fan. Therefore, the heat dissipation function is performed under the minimized influence of noise.

It is to be understood that both the foregoing general description and the following detailed description are by examples, and are intended to provide further explanation of the invention as claimed.

BRIEF DESCRIPTION OF THE DRAWINGS

The advantages of the present invention are to be understood by the following exemplary embodiments and with reference to the attached drawings. The illustrations of the drawings are merely exemplary embodiments and are not to be considered as limiting the scope of the present invention.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the invention.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

As mention above, with the use of high-performance computer components, fans with high revolution speed are used to for thermal dissipation. However, with the use of the fans with high revolution speed, the noise generated by the fans also affects the operation of the hard disk.

With the use of high-performance computer components, high-speed fan units will be used for heat dissipation purposes. However, with the use of high-speed fan units, the noise generated by high-speed fan units will also affect the operation of the hard disk.

Figure 1:
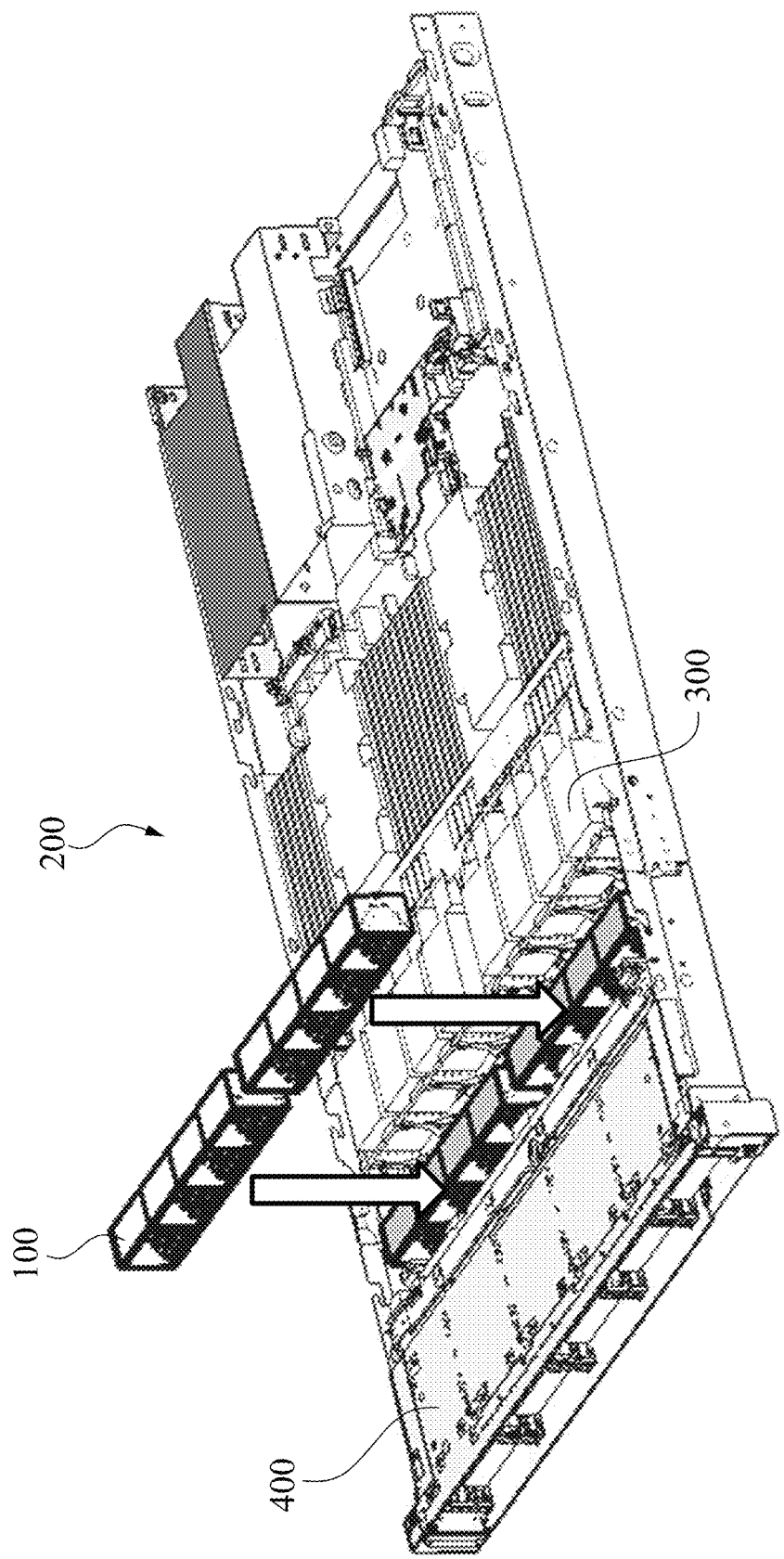
FIG. 1 illustrates a schematic view of a sound isolation window located in a computer system according to one embodiment of the present invention.

Please refer to FIG. 1. FIG. 1 illustrates a schematic view of a sound isolation window 100 located in a computer system according to one embodiment of the present invention. For example, the computer system is a server system, and a portion of the server system is configured in a rack 200.

As shown in FIG. 1, hard disks 400 are configured in the rack 200. For the purpose of the heat dissipation, the fan group 300 having fans is also configured in the rack 200 and close to the hard disk 400 to isolate noises caused by the fan group 300.

As shown in FIG. 1, the sound isolation window 100 is configured between the fan group 300 and hard disk 400 along the arrow direction. The sound isolation window 100 and the fan group 300 can be considered as an improved heat dissipation structure solving the issue about the computer components damaged by the noise of the fans. In some embodiments, the height of the sound isolation group is greater than the height of the fan group 300, and the noise caused by the fan group 300 can be fully isolated by the sound isolation window 100.

Figure 2:
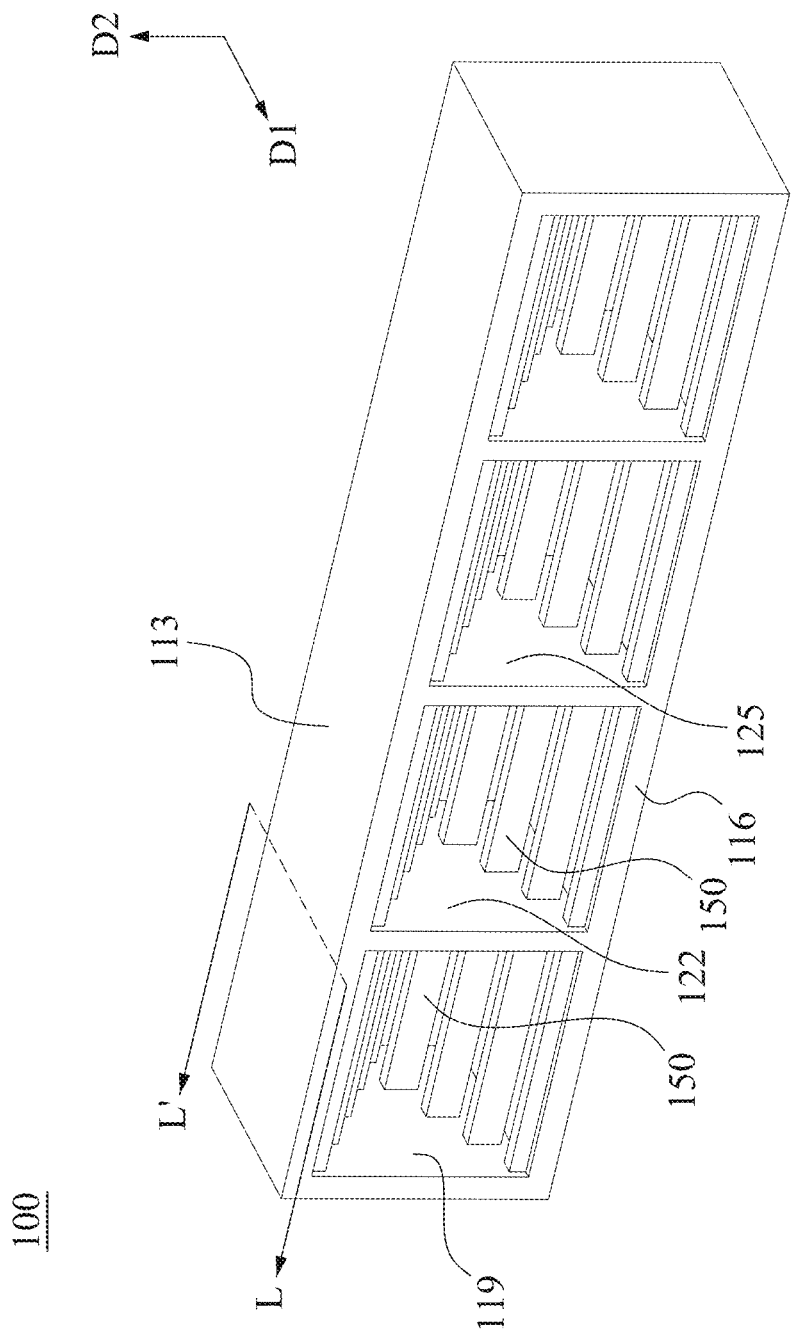
FIG. 2 illustrates a perspective view of a sound isolation window according to one embodiment of the present invention.
Figure 3:
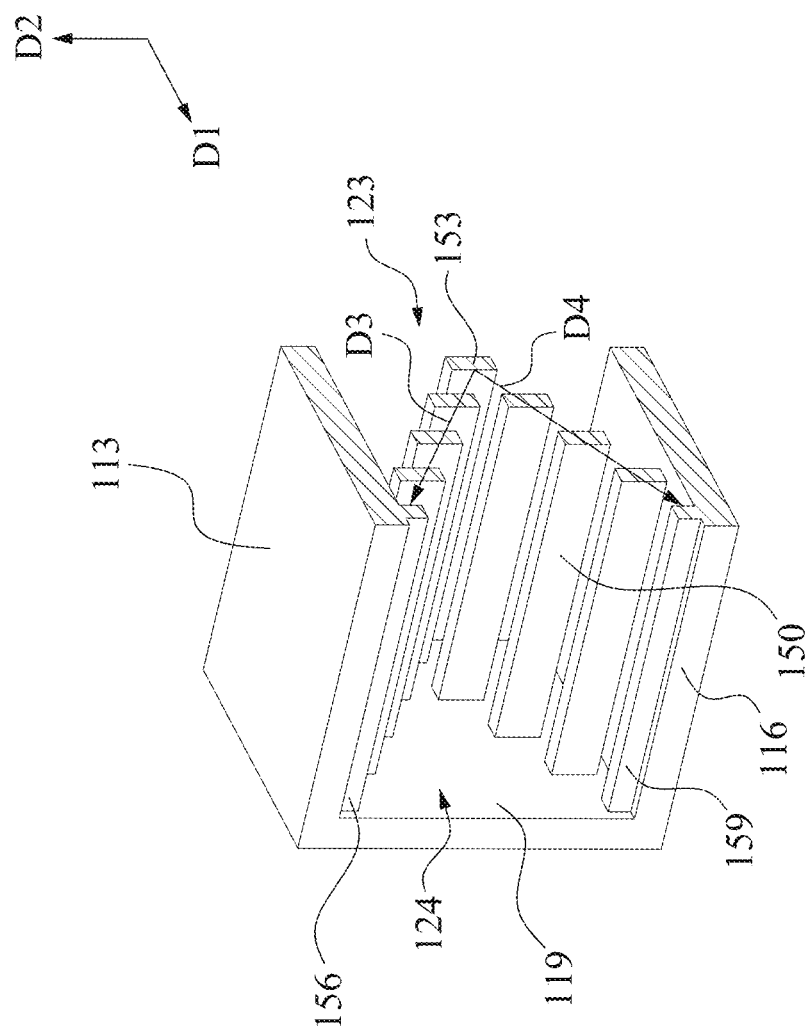
FIG. 3 illustrates a cross section of the sound isolation window of FIG. 2 along line L-L'.

Please refer to FIGS. 2 and 3 to illustrate the structure of the isolation window 100. FIG. 2 illustrates a perspective view of a sound isolation window 100 according to one embodiment of the present invention. FIG. 3 illustrates a cross section of the sound isolation window 100 of FIG. 2 along line L-L.

As shown in FIG. 2, the sound isolation window includes frame 110. The frame 110 has an upper frame portion 113 and an opposite lower frame portion 116. In this embodiment, the upper frame portion 113 and the lower frame portion 116 are two opposing top plate and bottom plate respectively, and the upper frame portion 113 and the lower frame portion 116 are substantially parallel to each other.

The frame 110 of the sound isolation window 100 has a plurality of sidewalls. In this embodiment, a sidewall 119, a sidewall 122, a sidewall 125, and the like are included, and these sidewalls are connected to the upper frame portion 113 and the lower frame portion 116. The upper frame portion 113, the lower frame portion 116, the sidewall 119 and the sidewall 122 form a sub window, and this sub window includes opposite first openings 123 and second openings 124 (see the following discussion). Similarly, the upper frame portion 113 and the lower frame portion 116, the sidewall 122 and the sidewall 125 can form another sub window also have two opposite openings.

In this embodiment, the sound isolation window 100 is formed by 4 sub windows mentioned above. In other embodiments, the sound isolation window 100 can be formed by other amounts of sub windows. In addition, in this embodiment, the distance between the sidewall 119 and the sidewall 122 is equal to the distance between the sidewall 122 and the sidewall 125, and size of each sub window is the same but not limited to the present invention. The purpose of providing multiple sub windows is to further increasing the area of noise insulation of the sound isolation window 100, and the multiple sub windows can also strengthen the structural strength of the sound isolation window 100. For details, see the following discussion.

Between the sidewall 119 and the sidewall 122 of the sound isolation window 100, the frame 110 further includes a plurality of sound blocking bars 150 used for blocking the noise from the fan group 300, and two ends of the each sound blocking bar 150 are respectively connected to the first sidewall 119 and the second sidewall 122. Similarly, there are a plurality of sound blocking bars 150 between the sidewall 122 and the sidewall 125. Referring to FIG. 3, under a cross section along the line L-L', it can be further illustrated the arrangement of the sound blocking bars 150 between the sidewall 119 and the sidewall 122 in one embodiment of the present invention. As shown in the FIG. 3, the width of each sound blocking bar 150 is less than one-half of the width of the first opening 123 or the second opening 124 to facilitate subsequent air circulation.

As mentioned above, the upper frame portion 113, the lower frame portion 116, the sidewall 119, and the sidewall 122 (not shown in FIG. 3) form a sub window, and the sub window has a first opening 123 and a second opening 124 opposite to each other. A direction D1 can be defined by a direction from the first opening 123 to the second opening 124. Another direction D2 can be defined by a direction from the upper frame portion 113 to the lower frame portion 116. In this embodiment, the direction D2 is perpendicular to the direction D1.

Please return to FIG. 2. As described above, in this embodiment, the sound isolation window 100 is composed of sub windows formed by the upper frame portion 113, the lower frame portion 116, and two sidewalls (for example, the side walls 119 and 122). As shown in the figure, each sub window has a plurality of sound blocking bars 150 whose width in the direction D2 is smaller than one half of the width of the first opening 123 or the second opening 124. Once the length of the sound blocking bars 150 in the direction D2 is increased, the sound blocking bars 150 will be easily broken and easily damaged. Due to the design of multiple sub windows, in this embodiment, the length of the sound blocking bars 150 will not be too long, which will affect the overall structural strength of the sound isolation window 100.

Please return to FIG. 3. In FIG. 3, the sound blocking bars 150 are arranged in parallel in the direction D1 and spaced from each other. In the direction D2, the sound blocking bars 150 partially overlap each other. This allows gaps between the sound blocking bars 150, and the gap between the sound blocking bars 150 can minimally affect the air circulation. Projections along the direction D1 of the sound blocking bars 150 over the first opening 123 can cover the first opening 123, and it enables the noise sound waves entering from the first opening 123 to be blocked by the sound blocking bars 150.

In FIG. 3, the shape of each sound blocking bar 150 is a rectangular strip or a rectangular blade, so each sound blocking bar 150 has a plane perpendicular to the upper frame portion 113 and the lower frame portion 116, and these planes respectively face to the first opening 123 and the second opening 124. In this embodiment, the plane of each sound blocking bar 150 is perpendicular to the sidewall 119 and the sidewall 122. Therefore, in this embodiment, the fan group 300 may be located at a side of the first opening 123 (as shown in FIG. 1), so that when the noise sound wave enters from the first opening 123, the noise sound wave can be directly reflected by the plane of the sound blocking bars 150. For details, please refer to the following discussion of FIGS. 4 and 5. In some embodiments, the fan group 300 can also be located at the side of the second opening 124. The shape of these sound blocking bars 150 is an embodiment but not limited thereto. It is only required that the sound blocking bars 150 have a surface that faces the first opening 123 or the second opening 124 and is perpendicular to the upper frame portion 113 and the lower frame portion 116, and the planes of the sound blocking bars can be used to reflect noise sound waves.

As shown in FIG. 3, in order to further increase the gap space through which the gas flow can flow, the sound blocking bars 150 are arranged in a stepped arrangement. In FIG. 3, a sound blocking bar 153 of the sound blocking bars 150 is located immediately adjacent to the first opening 123. The term "immediately adjacent to" means that among the plurality of sound blocking bars 150, the sound blocking bar 153 is closest to the first opening 123. In this embodiment, the sound blocking bar 153 is provided between the upper frame portion 113 and the lower frame portion 116. Another sound blocking bar 156 is located immediately adjacent to the second opening 124 and is connected to the upper frame portion 113. A direction D3 can be defined by a direction from the sound blocking bar 153 to the sound blocking bar 156, and a part of the sound blocking bars 150 is arranged in a stepped arrangement along an inclined surface extending in the direction D3. This corresponds to that, in the direction D1, the part of the sound blocking bars 150 are equidistant from each other. Therefore, the air can be able to flow to the different gaps between the sound blocking bars 150, and the gaps between the sound blocking bars 150 are located on the inclined plane extending in the direction D3. The stepped arrangement design can make sound blocking bars 150 always have a plane facing the first opening 123 (or the second opening 124) for reflecting noise and sound waves.

Since the gaps are between the sound blocking bars 150 and only partially overlap each other, the stepped arrangement design is also beneficial to the cleaning of the sound blocking bars 150 in the subsequent sound isolation window 100.

Further, in this embodiment, as shown in FIG. 3, the sound isolation window 100 further have a sound blocking bar 159 on the lower frame portion 116 with respect to the sound blocking bar 156. The sound blocking bar 159 is located immediately adjacent to the second opening 124 and is connected to the lower frame portion 116. A direction D4 can be defined by a direction from the sound blocking bar 153 to the sound blocking bar 159, and the other part of the sound blocking bars 150 is in stepped arrangement and equally spaced along the direction D4. Similar to the part of sound blocking bars 150 arranged in the direction D3, the other part of the sound blocking bars 150 arranged in the direction D4 can also keep the plane facing the first opening 123 or the second opening 124 to reflect the noise sound wave, and it can also provide a large area where the air can flow in the direction D4. Through the arrangement of the sound blocking bars 150 in the direction D3 and the direction D4, in this embodiment, the sound blocking bars 150 have an arrangement similar to a V-shape. The sound blocking bars 150 arranged in the direction D3 can be referred to as an upper stepped arrangement. The sound blocking bars 150 arranged along the direction D4 may be referred to as a lower stepped arrangement. Thus, in the present embodiment, the upper and lower stepped arrangement of the sound blocking bars 150 are mirror symmetrically. Other arrangements of the sound blocking bars used for increasing the air flow area can also be applied to other embodiments of the present invention.

Figure 5:
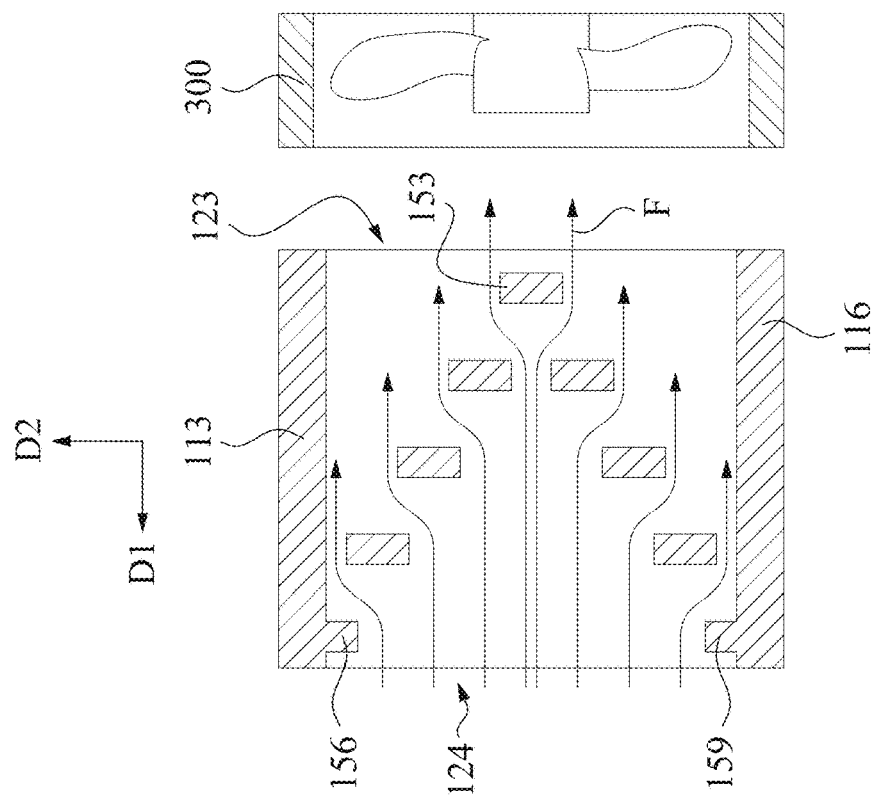
FIG. 5 illustrates a schematic view of air flow generated by a fan flowing to gaps between sound blocking bars of the sound isolation window according to one embodiment of the present invention.
Figure 4:
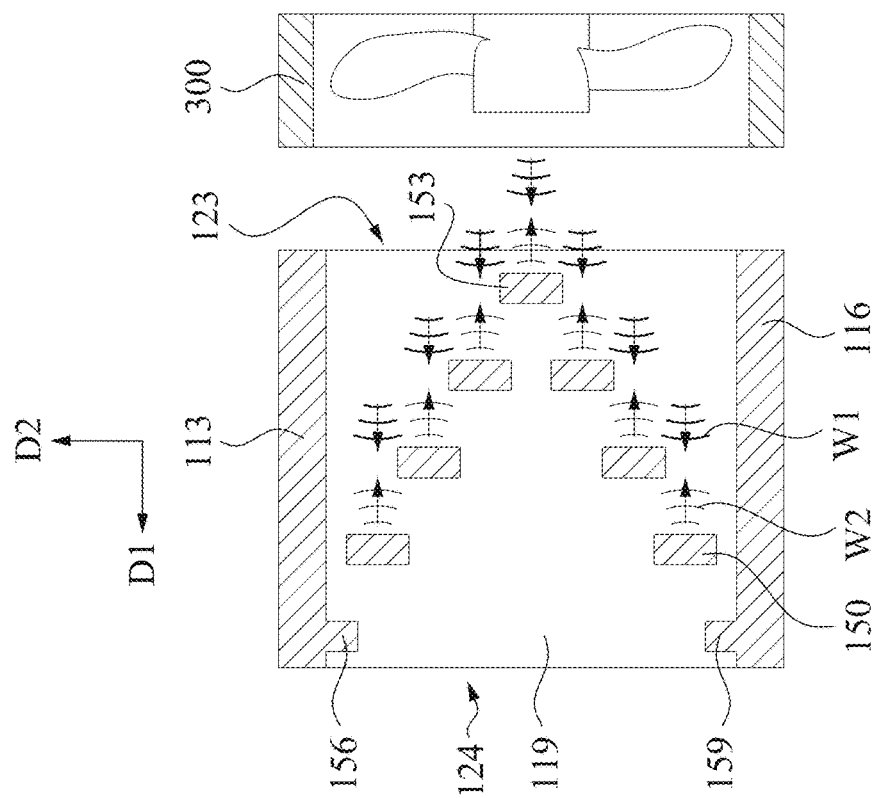
FIG. 4 illustrates a schematic view of a noise caused by a fan isolated by a sound isolation window according to one embodiment of the present invention.

Please refer to FIG. 4 and FIG. 5 to further illustrate the heat dissipation structure formed by the sound isolation window 100 and the fan group 300, how the sound blocking bars 150 of the sound isolation window 100 are configured to block the noise, and how the air can flow to the gaps between the sound blocking bars 150. The fan group 300 is configured at the side of the first opening 123 of the sound isolation window 100, and the sound blocking bars 150 of the sound isolation window 100 have a plane facing one of the fans of the fan group 300.

FIG. 4 illustrates a schematic view of a noise caused by a fan of the fan group 300 isolated by a sound isolation window 100 according to one embodiment of the present invention. As shown in FIG. 4, when one of the fans of the fan group 300 operates, the incident sound wave W1 incident from the first opening 123 is generated. Most of the incident sound waves W1 is incident in the direction D1, and thus can be directly reflected by the plane of the sound blocking bars 150 facing the first opening 123. Most of the incident sound waves W1 can be reflected as reflected sound waves W2. Most of the noise and vibration of the incident sound wave W1 are not transmitted to the second opening 124, thereby protecting the computer components provided in the second opening 124 from being affected by noise and stopping operation.

FIG. 5 illustrates a schematic view of air flow generated by a fan flowing to gaps between sound blocking bars 150 of the sound isolation window 100 according to one embodiment of the present invention. Since the sound blocking bars 150 are in a stepped arrangement, the area where the airflow F can flow has been increased, and the airflow F can flow to the gap between the sound blocking bars 150. Under the situation that the noise issue has been improved as shown in FIG. 4, one of the fans of the fan group 300 is able to guide the airflow smoothly, and the heat dissipation function is exerted.

In summary, the sound isolation window of the present invention can be configured in the rack of a computer system such like a serve, and the sound isolation window is used to isolate the noise caused by the fans. The noised caused by the fans can affect the operation of the computer components of the computer system. The multiple sub window design in the sound isolation windows enhances the strength of the overall structure. Sound blocking bars of the sound isolation window are between the sidewalls of one of the sub windows, and each sound blocking bar has a plane facing an opening of the corresponding sub window to directly reflect the noise sound wave. Gaps are between the sound blocking bars, and the airflow can still flow to the computer components. The airflow is guided by the sound blocking bars. The stepped arrangement of the sound blocking bars in the sound isolation window can increase the area where the airflow can flow, and it minimizes the influence of the airflow and maintains the cooling function of the fan.

Although the present invention has been described in considerable detail with reference to certain embodiments thereof, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A sound isolation window, comprising:
    a frame, having an upper frame portion, an opposite lower frame portion and a first sidewall and a second sidewall connected to the upper frame portion and the lower frame portion, wherein the upper frame portion, the lower frame portion, the first sidewall and the second sidewall form a first opening and an opposite second opening; and
    a plurality of sound blocking bars, wherein two ends of each sound blocking bar are respectively connected to the first sidewall and the second sidewall, and each sound blocking bar comprises a plane perpendicular to the upper frame portion and the lower frame portion,
    wherein the sound blocking bars are arranged along a first direction from the first opening to the second opening and spaced apart from each other, projections along the first direction of the sound blocking bars over the first opening cover the first opening, and a width of each sound blocking bar is less than one-half of a width of the first opening,
    wherein a first sound blocking bar of the sound blocking bars is immediately adjacent to the first opening, a second sound blocking bar of the sound blocking bars is immediately adjacent to the second opening and connected to the upper frame portion, another second sound blocking bar is immediately adjacent to the second opening and connected to the lower frame portion, and the two second sound blocking bars are opposite to each other.

2. The sound isolation window of claim 1, wherein the frame further has a third sidewall connected to the upper frame portion and the lower frame portion, the third sidewall is disposed outside the first sidewall and the second sidewall and is adjacent to the second sidewall, the upper frame portion, the lower frame portion, the second sidewall and the third sidewall form a third openings and a opposite fourth opening, and a plurality of sound blocking bars are disposed between the second sidewall and the third sidewall.

3. The sound isolation window of claim 1, wherein the sound blocking bars partially overlap each other in a second direction perpendicular to the first direction.

4. The sound isolation window of claim 1, wherein the plane of each of the sound blocking bars is perpendicular to the first sidewall and the second sidewall.

5. The sound isolation window of claim 1, wherein the sound blocking bars are arranged in parallel in the first direction.

6. The sound isolation window of claim 1, wherein the sound blocking bars are in a stepped arrangement.

7. The sound isolation window of claim 1, wherein sound blocking bars form an upper stepped arrangement structure and a lower stepped arrangement structure, and the upper and lower stepped arrangement structure are mirror symmetry.

8. The sound isolation window of claim 1, wherein a part of the sound blocking bars arrange along a third direction extending from the first sound blocking bar to the second sound blocking bar in a stepped arrangement, and another apart of the sound blocking bars arrange along a fourth direction extending from the first sound blocking bar to another second sound blocking bar in a stepped arrangement.

9. A thermal dissipation structure, comprising:
    the sound isolation window of claim 1; and
    a fan, disposed at a side of the sound isolation window, wherein the planes of each of the sound blocking bars faces toward the fan.

* * * * *